United States Patent
Huang

[11] Patent Number: 6,110,799
[45] Date of Patent: Aug. 29, 2000

[54] TRENCH CONTACT PROCESS

[75] Inventor: Qin Huang, Blacksburg, Va.

[73] Assignee: Intersil Corporation, Palm Bay, Fla.

[21] Appl. No.: 08/885,879

[22] Filed: Jun. 30, 1997

[51] Int. Cl.[7] .................................................. H01L 21/76
[52] U.S. Cl. ...................... 438/430; 438/221; 438/268; 438/337; 257/329
[58] Field of Search ..................... 438/440, 221, 438/223, 294, 295, 296, 237, 268, 293, 315, 316, 336, 337, 348, 355, 256, 329, 330, 331; 257/330, 331, 377, 325–332

[56] References Cited

U.S. PATENT DOCUMENTS

| | | | |
|---|---|---|---|
| 5,071,782 | 12/1991 | Mori | 438/589 |
| 5,554,862 | 9/1996 | Omura et al. | 257/331 |
| 5,623,152 | 4/1997 | Majumdar et al. | 257/330 |
| 5,648,670 | 7/1997 | Blanchard | 257/329 |
| 5,689,128 | 11/1997 | Hshieh et al. | 257/329 |
| 5,693,569 | 12/1997 | Ueno | 438/270 |
| 5,705,409 | 1/1998 | Witek | 438/589 |
| 5,710,072 | 1/1998 | Krautschneider et al. | 438/270 |
| 5,719,409 | 2/1998 | Singh et al. | 257/328 |
| 5,879,971 | 3/1999 | Witek | 438/270 |

OTHER PUBLICATIONS

Stanley Wolf Silicon Processing for the VSLI Era vol. 2 Lattice press p. 558, 1990.

*Primary Examiner*—Chandra Chaudhari
*Assistant Examiner*—David S Blum
*Attorney, Agent, or Firm*—Rogers & Killeen

[57] ABSTRACT

A trench process for establishing a contact for a semiconductor device with trenches such as the trench and planar MOSFETs (UMOS), trench and planar IGBTs and trench MCTs which reduces the number of masks and eliminates the need for lateral diffusion into the trench channel region. Improved control of the parasitic transistor in the trench MOSFET is also achieved. The cell size/pitch is reduced relative to conventional processes which require source block and P+ masks.

8 Claims, 5 Drawing Sheets

TRENCH CONTACT PROCESS

This application is related to U.S. patent application Ser. No. 08/885,922 entitled "SEMICONDUCTOR STRUCTURES WITH TRENCH CONTACTS" owned by the assignee hereof and filed concurrently herewith.

BACKGROUND OF THE INVENTION

The present invention relates to a trench process for the formation of contacts on semiconductor devices such as MOSFETs and the semiconductor structures which may be made thereby.

The conventional trench process for forming MOSFETs uses a total of six masks; i.e., 1. a first mask for defining a buried layer region in a semiconductor;
2. a second mask for defining an active area;
3. a source mask for source implantation;
4. a trench mask for defining the trench of etching and filling;
5. a contact mask to define the areas of contacts; and
6. a metal mask.

This process results in a relatively deep junction, wider cell pitch, wider source width and a stronger parasitic transistor problem.

Accordingly, it is an object of the present invention to provide a novel trench process which uses fewer masks and a MOSFET structure which reduces the problems associated with the conventional process and resulting structure.

It is another object of the present invention to provide a novel trench process for a MOSFET structure where the buried layer may easily be made deeper than the depth of the trench gate.

It is yet another object of the present invention to provide novel structures for both trench and planar devices.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

The novel process of the present invention will be illustrated in connection with a P channel MOSFET, but it is to be understood that the process is equally applicable to N channel MOSFETs.

Figure 1:
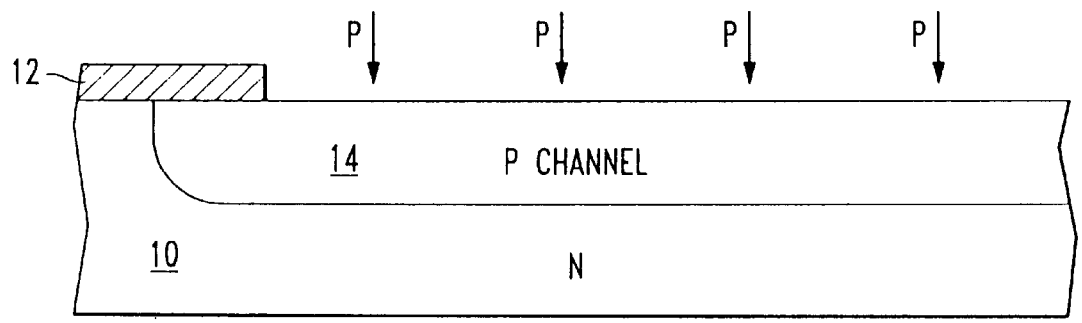
FIGS. 1–9 illustrate the sequence of steps in the novel process of the present invention.

With reference to FIG. 1, the surface of a N type semiconductor wafer 10 is masked by a conventional mask 12 to define an active region, and a P type impurity is implanted in a conventional manner and driven, e.g., by annealing, to form a P channel region 14.

Figure 2:
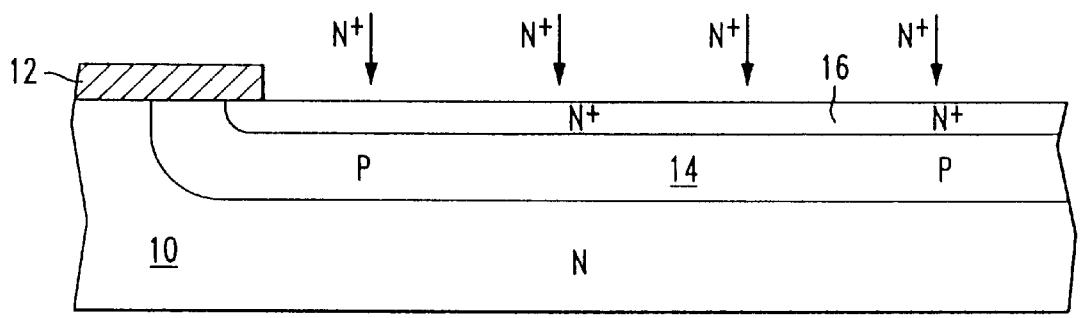

As shown in FIG. 2, a N type polarity impurity may then be implanted and driven into the channel area 14 to form a N+ source region 16 adjacent the surface of the wafer.

Figure 3:
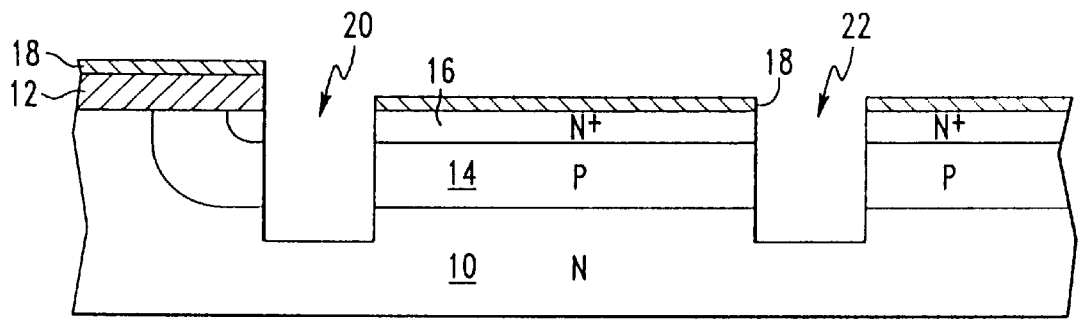

A second conventional mask 18 may then be used as shown in FIG. 3 to define the area for two trenches 20, 22. The trenches 20,22 may then be etched in a suitable conventional manner downwardly through the N+ source region 16 and the P channel region 14 into N wafer.

Figure 4:
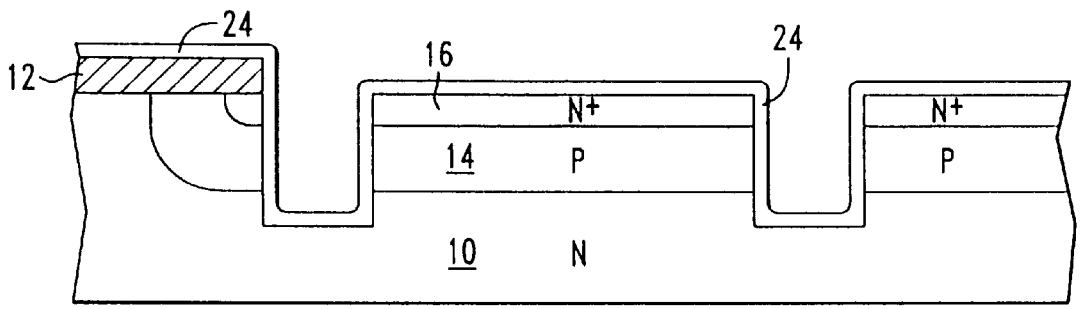

The second mask 18 of FIG. 3 may then be removed and a gate oxide layer 24 formed over all of the exposed upper surface of the semiconductor including the walls and bottom of the trenches 20,22 as shown in FIG. 4.

Figure 5:
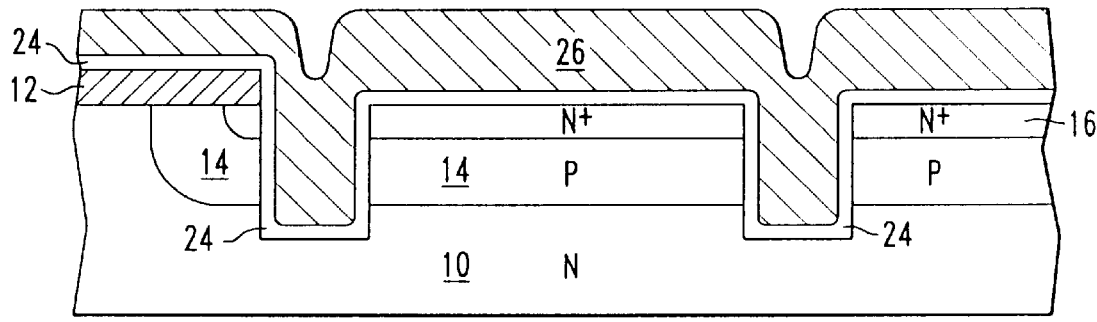

As shown in FIG. 5, a layer of polysilicon 26 may conventionally be provided over the gate oxide layer 24, completely filling the trenches 20,22.

Figure 6:
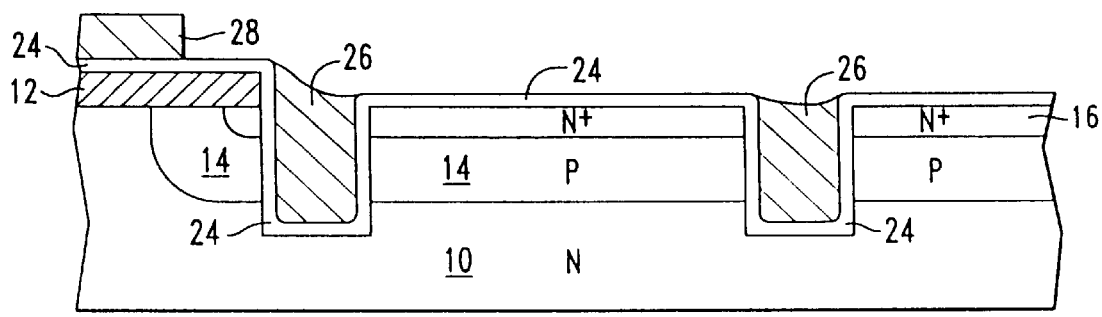

As shown in FIG. 6, a third mask 28 may then be provided to define an area larger than the active region defined by the mask 12 to protect the polysilicon layer 26 for establishing a contact at a later time. Thereafter, the polysilicon layer 26 left unprotected by the mask 28 may be etched back to leave polysilicon 26 only in the trenches 20,22.

Figure 7:
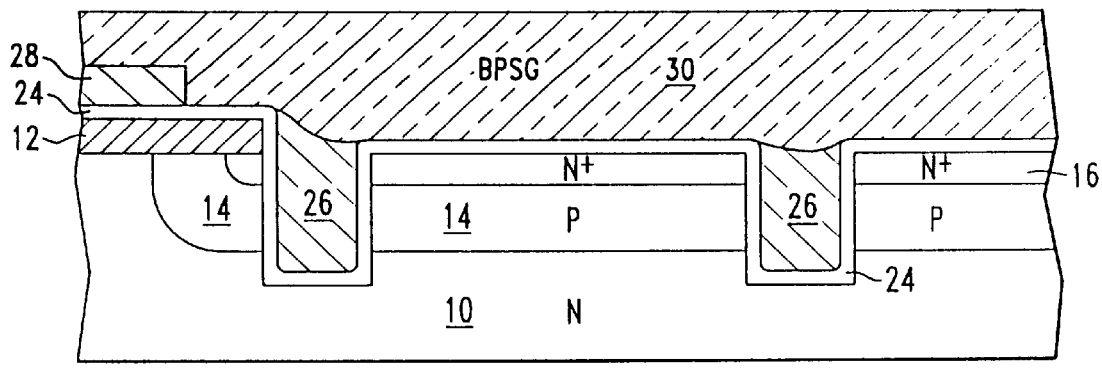
Figure 8:
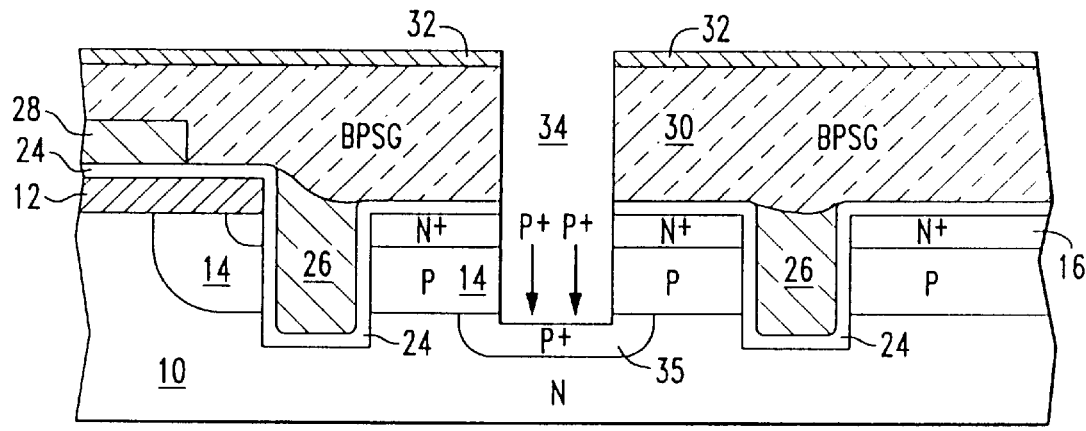

A layer of borophosphosilicate glass ("BPSG") 30 may then be formed over the surface of the semiconductor as shown in FIG. 7, and, as shown in FIG. 8, a fourth mask 32 may be conventionally formed over the BPSG layer 30 to thereby define a the area for a third trench 34 which may be etched through the BPSG layer 30, the gate oxide 24, the N+ source 16, and the P channel area 14 into the N semiconductor 10. Once the trench 34 has been etched, a P type impurity may be implanted and driven into the N wafer to thereby form a P+ area 35 of higher impurity concentration than the P channel region 14.

Figure 9:
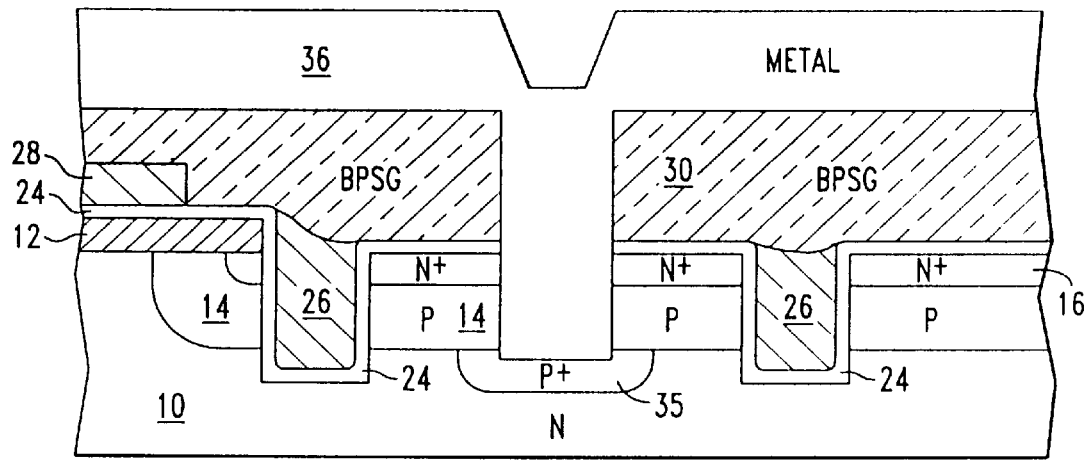

As illustrated in FIG. 9, a metal layer 36 may then be formed over both the BPSG area 30 to thereby establish a contact with the N+ source region and the P+ high concentration region 35 at the bottom of the trench 34 of FIG. 8 on both components of the PN junction.

The four mask trench process of the present invention eliminates two masks used in the prior art process, i.e., the P+ mask and the source block mask, and it makes alignment easier to achieve, i.e., the only alignment required is the contact to the trench.

Figure 10:
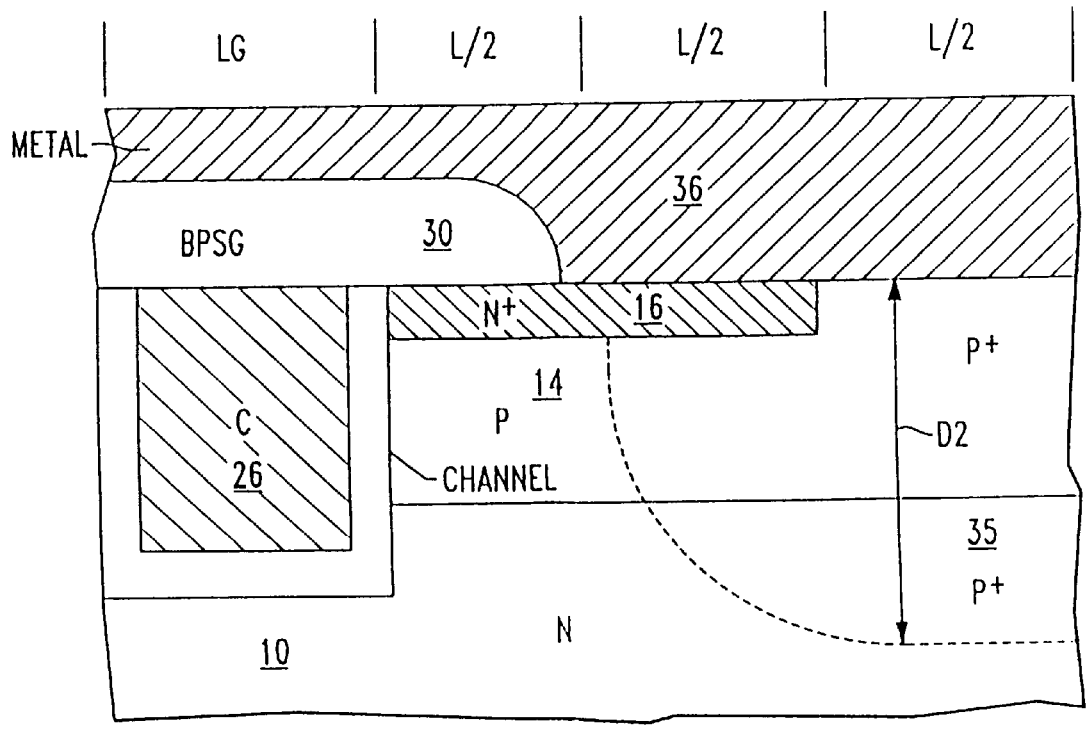
FIG. 10 illustrates the structure which results from the conventional trench process.

The six mask process of the prior art process results in a structure as shown in FIG. 10 and provides a ready contrast with the structure of the present trench process.

In the prior art structure of FIG. 10, the cell pitch is equal to the length of the gate ("LG") plus three times the length of the design rule value ("L") and the width of the source is equal to L.

Figure 11:
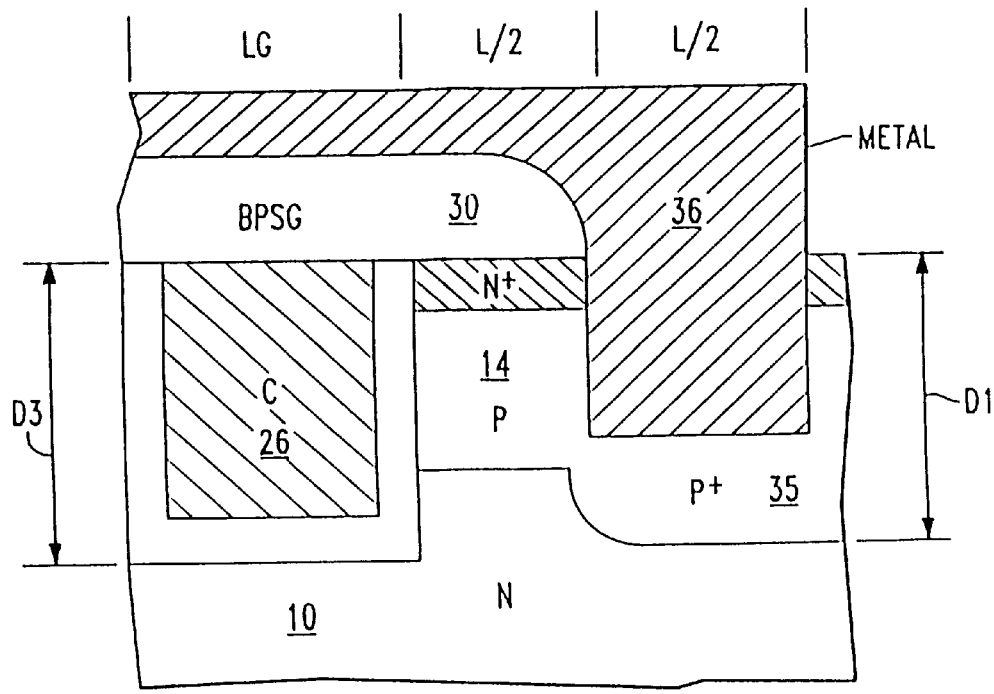
FIG. 11 illustrates the novel structure which results from the trench process of the present invention.
Figure 12:
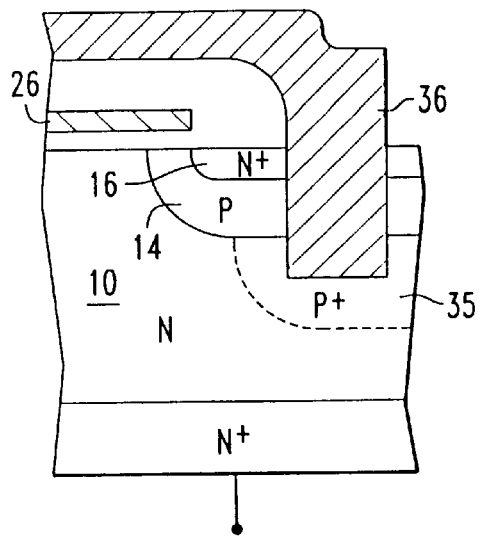
FIG. 12 illustrates the novel structure of the present invention embodied in a planar MOSFET.
Figure 13:
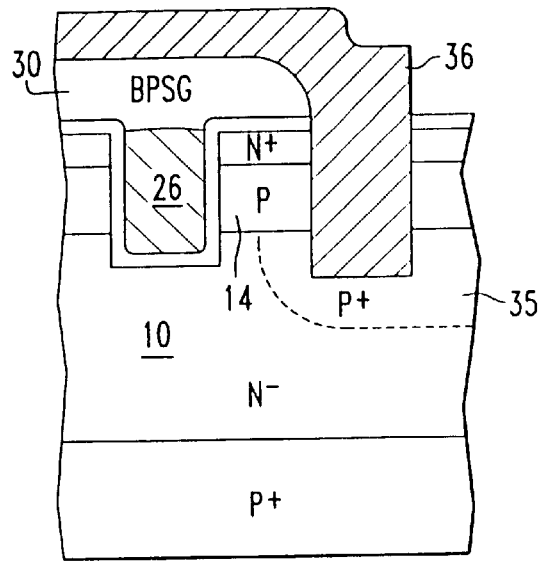
FIG. 13 illustrates the novel structure of the present invention embodied in a trench insulated gate bipolar transistor ("IGBT").
Figure 14:
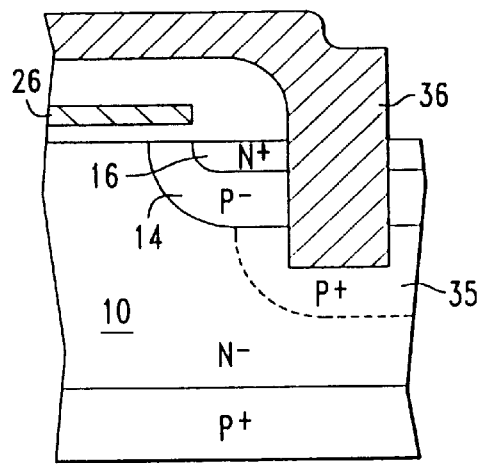
FIG. 14 illustrates the novel structure of the present invention embodied in a planar IGBT.

In contrast, the structure of FIG. 11 provides a cell pitch of LG plus 2L, a saving of L and the width of the source is reduced to L/2. In addition, the depth D1 of the P+ high concentration area or buried layer 35 may be significantly reduced below the depth D2 in FIG. 10 because the depth D2 is necessitated to achieve the lateral diffusion of the P+ implant under the source 16. Because of the impact of the lateral diffusion on the channel 14, the length of the source, and thus the design rule value L, negatively impacts on the pitch of the device. Because the length of the source 16 is reduced in FIG. 11, it is possible to reduce the design rule value L and the pitch.

Additionally, the depth D1 of the buried layer 35 in FIG. 11 may be greater than the depth D3 of the trench gates 20,22, making it possible for the MOSFET to break down at the PN junction 35 and protect the trench gate 20,22.

Figure 15:
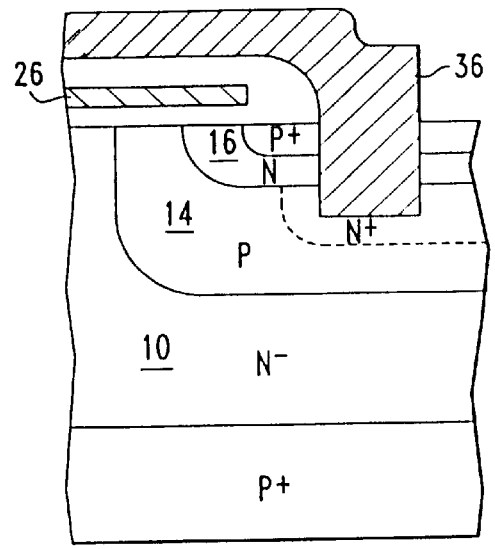
FIG. 15 illustrates the novel structure of the present invention embodied in a planar MCT.

With reference to FIGS. 12–15 in which like numerical references have been retained with the structures of FIGS. 10 and 11 to facilitate a comparison therewith, the present invention may be embodied in a planar MOSFET (FIG. 12), a trench IGBT (FIG. 13), a planar IGBT (FIG. 14) and a planar MCT (FIG. 15).

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of manufacturing a semiconductor device using a trench for conductor formation comprising the steps of:

(a) providing a semiconductor of a first polarity;

(b) providing a first mask for a surface of the semiconductor to thereby define an active region on the semiconductor;

(c) implanting an impurity of a second semiconductor polarity in the surface exposed by the active region mask and annealing the semiconductor to drive in the second polarity semiconductor impurity to thereby create a second polarity region in the semiconductor;

(d) implanting an impurity of the first polarity in the channel region and annealing the semiconductor to drive the first polarity impurity into the channel region to thereby create a first polarity surface region adjacent the surface of the semiconductor;

(e) providing a second mask defining a trench region on the exposed surface;

(f) forming first and second spaced apart trenches extending downwardly through the second mask, the source region and the channel region into the semiconductor;

(g) forming a gate oxide layer over the exposed upper surface of the semiconductor and the walls and bottom of the first and second trenches;

(h) providing a layer of polysilicon over the gate oxide layer completely filling the first and second trenches;

(i) providing a third mask to thereby define an area larger than the active region to protect the polysilicon layer for later gate contact;

(j) etching back the polysilicon layer overlying the gate oxide in the area not protected by the third mask to leave the trenches filled with polysilicon;

(k) forming a layer of BPSG over the exposed surface of the semiconductor, gate oxide layer and first and second trenches;

(l) forming a fourth mask over the BPSG layer defining a third trench intermediate the first and second trenches;

(m) doping the semiconductor at the bottom of the third trench with an impurity of the second polarity to thereby create a density greater than the density of the impurity of the second polarity in the channel region to thereby create a high concentration region adjacent the bottom of the third trench; and (n) forming a metal layer overlying both the BPSG layer and the area of the third trench to thereby establish electrical contacts with the first polarity layer and the second polarity layer.

2. The method of reducing the cell pitch of an integrated circuit having a horizontal PN junction comprising the steps of:

(a) forming a pair of spaced trenches of a first electrically conducting material surrounded by insulation in said integrated circuit;

(b) forming a third trench between said pair of spaced trenches; and, (c) filling said third trench with a metal to establish a metal contact with the semiconductor on both components of the PN junction along a generally vertical plane.

3. The method of claim 1, wherein the high concentration region is formed by annealing the semiconductor to drive the impurity of the second polarity into the semiconductor.

4. The method of claim 1, wherein the high concentration region is formed by diffusing the impurity into the semiconductor.

5. The method of claim 2, furthering including the step of diffusing a dopant from the bottom of said third trench into the semiconductor before the step of filling said third trench with a metal to thereby form a buried layer of high dopant concentration in contact with one of the components of the PN junction.

6. The method of claim 5 wherein the metal in the third trench contacts the buried layer as well as both components of the PN junction.

7. A method of creating a semiconductor structure with a horizontal PN junction where the location of the FET break down occurs at the point other than said horizontal PN junction comprising the steps of:

(a) forming a pair of spaced trenches of a first electrically conducting material surrounded by insulation in said semiconductor structure;

(b) forming a third trench between said pair of spaced trenches; and, (c) diffusing a dopant from the bottom of said third trench into the semiconductor to thereby form a layer of high dopant concentration; and, (d) filling said third trench with a metal to establish a metal contact with said semiconductor structure on both components of the PN junction and with said layer of high dopant concentration along a generally vertical plane.

8. The method of claim 7 wherein the layer of high dopant concentration is in contact with the component of said PN junction of the same conductivity.

* * * * *